US012598769B2

(12) United States Patent
Kong et al.

(10) Patent No.: US 12,598,769 B2
(45) Date of Patent: Apr. 7, 2026

(54) SEMICONDUCTOR DEVICE AND MANUFACTURING METHOD THEREOF

(71) Applicant: Fujian Jinhua Integrated Circuit Co., Ltd., Quanzhou City (CN)

(72) Inventors: Guoguo Kong, Quanzhou City (CN); Gang Wu, Quanzhou City (CN); Mingru Ge, Quanzhou City (CN); Shiwei He, Quanzhou City (CN); Hsien-Shih Chu, Quanzhou City (CN); Junkun Chen, Quanzhou City (CN)

(73) Assignee: Fujian Jinhua Integrated Circuit Co., Ltd., Quanzhou City (CN)

( * ) Notice: Subject to any disclaimer, the term of this patent is extended or adjusted under 35 U.S.C. 154(b) by 510 days.

(21) Appl. No.: 18/128,253

(22) Filed: Mar. 30, 2023

(65) Prior Publication Data

US 2024/0204101 A1 Jun. 20, 2024

(30) Foreign Application Priority Data

Dec. 20, 2022 (CN) .......................... 202211644161.5
Dec. 20, 2022 (CN) .......................... 202223422911.2

(51) Int. Cl.
*H10D 30/63* (2025.01)
*H01L 21/311* (2006.01)
*H10D 30/01* (2025.01)

(52) U.S. Cl.
CPC ........ *H10D 30/63* (2025.01); *H01L 21/31111* (2013.01); *H10D 30/025* (2025.01)

(58) Field of Classification Search
CPC ............................. H10D 30/63; H10D 30/025
See application file for complete search history.

(56) References Cited

U.S. PATENT DOCUMENTS

2024/0204101 A1* 6/2024 Kong ................... H10D 30/025

* cited by examiner

*Primary Examiner* — Mark V Prenty
(74) *Attorney, Agent, or Firm* — Winston Hsu

(57) ABSTRACT

A semiconductor device and a manufacturing method thereof are disclosed in the present invention. The semiconductor device includes a source structure; a gate structure disposed above the source structure; a first opening penetrates through the gate structure in a vertical direction; a semiconductor structure; a gate dielectric layer; an insulation structure; and a void. The semiconductor structure is partially disposed in the first opening, and at least a portion of the gate structure is located at two opposite sides of the semiconductor structure in a horizontal direction. The gate dielectric layer is disposed in the first opening and located between the semiconductor structure and the gate structure. At least a portion of the insulation structure is disposed in the first opening, at least a portion of the semiconductor structure is located between the insulation structure and the gate dielectric layer, and the void is located in the insulation structure.

20 Claims, 13 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more particularly, to a semiconductor device including an insulation structure having a void and a manufacturing method thereof.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the require- ments of innovated products, and the size of each device has to become smaller accordingly. The conventional planar metal-oxide-semiconductor (MOS) transistor has difficulty when scaling down in the development of the semiconductor device. Therefore, the stereoscopic transistor technology or the non-planar transistor technology that allows smaller size and higher performance is developed to replace the planar MOS transistor for reducing the dimension of the transistor unit and/or improving the operation performance of the transistor unit.

SUMMARY OF THE INVENTION

A semiconductor device and a manufacturing method thereof are provided in the present invention. A void is formed in an insulation structure surrounded by a semicon- ductor structure for improving operation performance of the semiconductor device.

According to an embodiment of the present invention, a semiconductor device is provided. The semiconductor device includes a source structure, a gate structure, a first opening, a semiconductor structure, a gate dielectric layer, an insulation structure, and a void. The gate structure is disposed above the source structure. The first opening pen- etrates through the gate structure in a vertical direction. The semiconductor structure is partially disposed in the first opening, and at least a portion of the gate structure is located at two opposite sides of the semiconductor structure in a horizontal direction. The gate dielectric layer is disposed in the first opening and located between the semiconductor structure and the gate structure. At least a portion of the insulation structure is disposed in the first opening, at least a portion of the semiconductor structure is located between the insulation structure and the gate dielectric layer, and the void is located in the insulation structure.

According to an embodiment of the present invention, a manufacturing method of a semiconductor device is pro- vided. The manufacturing method includes the following steps. A gate structure is formed above a source structure. A first opening is formed penetrating through the gate structure in a vertical direction. A gate dielectric layer is formed in the first opening. An insulation structure is formed, at least a portion of the insulation structure is formed in the first opening, and a void is located in the insulation structure. A semiconductor structure is formed partially in the first opening. At least a portion of the gate structure is located at two opposite sides of the semiconductor structure in a horizontal direction, at least a portion of the semiconductor structure is located between the insulation structure and the gate dielectric layer, and the gate dielectric layer is located between the semiconductor structure and the gate structure.

These and other objectives of the present invention will no doubt become obvious to those of ordinary skill in the art after reading the following detailed description of the pre- ferred embodiment that is illustrated in the various figures and drawings.

BRIEF DESCRIPTION OF THE DRAWINGS

The accompanying drawings are directed to provide a better understanding of the embodiments and are included as parts of the specification of the present disclosure. These drawings and descriptions are used to illustrate the prin- ciples of the embodiments. It should be noted that all drawings are schematic, and the relative dimensions and scales have been adjusted for the convenience of drawing. Identical or similar features in different embodiments are marked with identical symbols.

FIG. 3, FIG. 4, FIG. 5, FIG. 6, FIG. 7, FIG. 8, and FIG. 9 are schematic drawings illustrating a manufacturing method of a semiconductor device according to an embodi- ment of the present invention, wherein FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, and FIG. 9 is a schematic drawing in a step subsequent to FIG. 8.

DETAILED DESCRIPTION

To provide a better understanding of the presented inven- tion, preferred embodiments will be described in detail. The preferred embodiments of the present invention are illus- trated in the accompanying drawings with numbered ele- ments. In addition, the technical features in different embodiments described in the following may be replaced, recombined, or mixed with one another to constitute another embodiment without departing from the spirit of the present invention.

Figure 1:
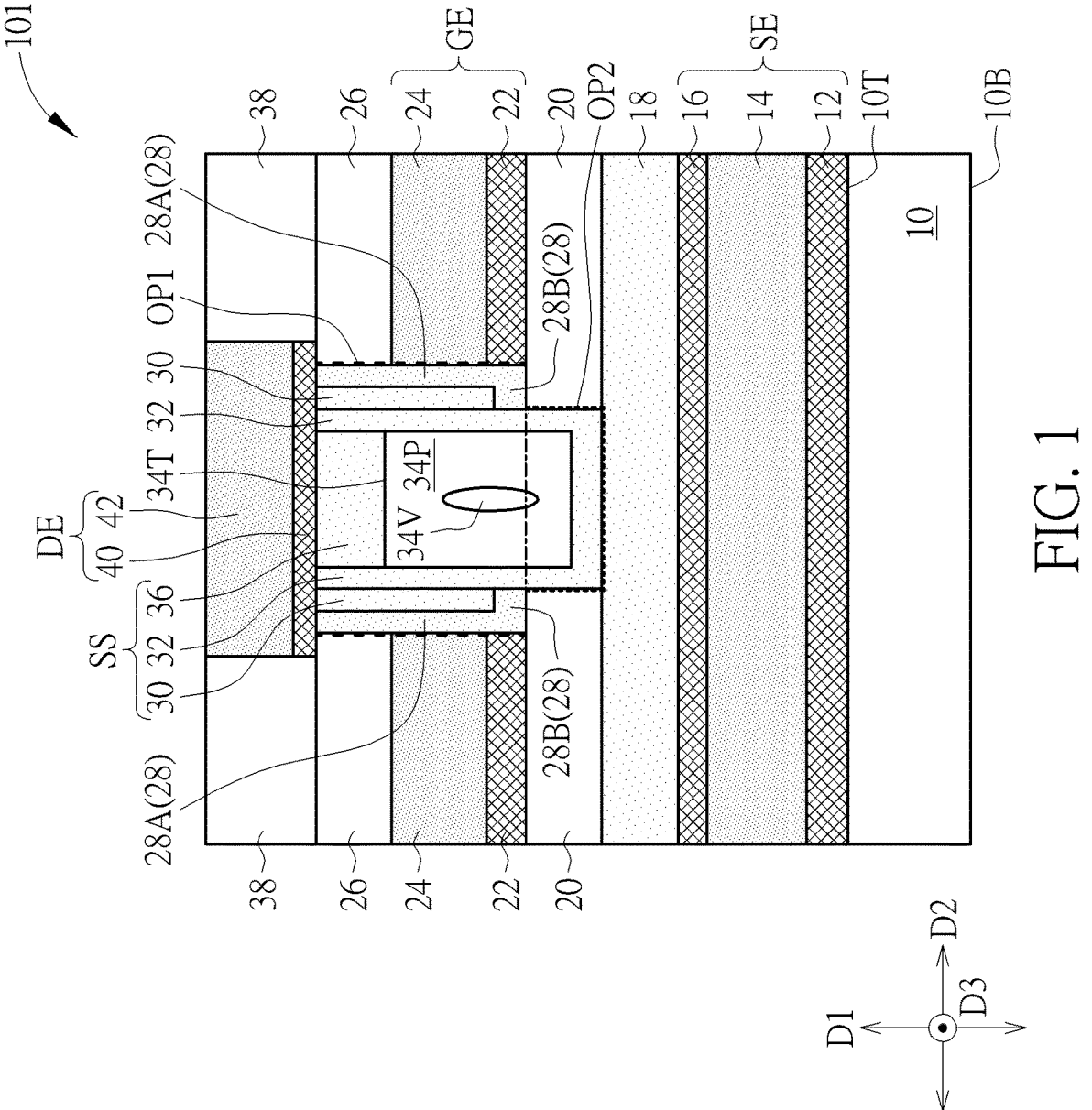
FIG. 1 is a cross-sectional schematic drawing illustrating a semiconductor device according to a first embodiment of the present invention.

Please refer to FIG. 1. FIG. 1 is a cross-sectional sche- matic drawing illustrating a semiconductor device 101 according to a first embodiment of the present invention. As shown in FIG. 1, the semiconductor device 101 includes a source structure SE, a gate structure GE, a first opening OP1, a semiconductor structure SS, a gate dielectric layer 28, an insulation structure 34P, and a void (such as a void 34V illustrated in FIG. 1). The gate structure GE is disposed above the source structure SE. The first opening OP1 penetrates through the gate structure GE in a vertical direction D1. The semiconductor structure SS is partially disposed in the first opening OP1, and at least a portion of the gate structure GE is located at two opposite sides of the semiconductor structure SS in a horizontal direction D2. The gate dielectric layer 28 is disposed in the first opening OP1 and located between the semiconductor structure SS and the gate structure GE. At least a portion of the insulation structure 34P is disposed in the first opening OP1, at least a portion of the semiconductor structure SS is located between the insulation structure 34P and the gate dielectric layer 28, and a void (such as the void 34V illustrated in FIG. 1) is located in the insulation structure 34P. The insulation structure 34P may be used to indirectly control the composition of the semiconductor structure SS and/or support the semiconductor structure SS, and the void 34V in the insulation structure 34P may be used to reduce the integral dielectric constant of the insulation structure 34P for improving the operation performance of the semiconductor device 101, but not limited thereto.

In some embodiments, the source structure SE, the gate structure GE, the first opening OP1, the semiconductor structure SS, the gate dielectric layer 28, and the insulation structure 34P described above may be disposed on an upper surface 10T of a dielectric layer 10. The upper surface 10T and a lower surface 10B of the dielectric layer 10 may be two opposite surfaces of the dielectric layer 10 in the vertical direction D1, and the vertical direction D1 may be regarded as a thickness direction of the dielectric layer 10 accordingly, but not limited thereto. In this description, a distance between the upper surface 10T of the dielectric layer 10 and a relatively higher location and/or a relatively higher part in the vertical direction D1 may be greater than a distance between the upper surface 10T of the dielectric layer 10 and a relatively lower location and/or a relatively lower part in the vertical direction D1. The bottom or a lower portion of each component may be closer to the upper surface 10T of the dielectric layer 10 in the vertical direction D1 than the top or upper portion of this component. Another component disposed above a specific component may be regarded as being relatively far from the upper surface 10T of the dielectric layer 10 in the vertical direction D1, and another component disposed under a specific component may be regarded as being relatively close to the upper surface 10T of the dielectric layer 10 in the vertical direction D1.

In some embodiments, the semiconductor device 101 may further include a bottom semiconductor layer 18, a dielectric layer 20, a drain structure DE, a dielectric layer 26, a dielectric layer 38, and a second opening OP2. The dielectric layer 20 and the bottom semiconductor layer 18 may be disposed between the gate structure GE and the source structure SE in the vertical direction D1, the bottom semiconductor layer 18 may be disposed between the dielectric layer 20 and the source structure SE in the vertical direction D1, and the semiconductor structure SS may penetrate through the dielectric layer 20 in the vertical direction D1 and be connected with (and/or physically contact) the bottom semiconductor layer 18. The dielectric layer 26 may be disposed on the gate structure GE in the vertical direction D1, and the first opening OP1 may penetrate through the dielectric layer 26 and the gate structure GE in the vertical direction D1. The dielectric layer 38 may be disposed on the dielectric layer 26 in the vertical direction D1, the drain structure DE may be disposed on the semiconductor structure SS, the gate dielectric layer 28, and the dielectric layer 26 in the vertical direction D1, and at least a portion of the drain structure DE may be disposed in the dielectric layer 38, but not limited thereto.

In some embodiments, the second opening OP2 may penetrate through the dielectric layer 20 in the vertical direction D1, the second opening OP2 may be directly connected with the first opening OP1, and a portion of the semiconductor structure SS may be disposed in the second opening OP2. Therefore, the semiconductor structure SS may be directly connected with the bottom semiconductor layer 18 via the second opening OP2. In some embodiments, the semiconductor structure SS may include a first semiconductor layer 30, a second semiconductor layer 32, and a third semiconductor layer 36. The first semiconductor layer 30 may be disposed in the first opening OP1, the second semiconductor layer 32 may be partly disposed in the first opening OP1 and partly disposed in the second opening OP2, and the third semiconductor layer 36 may be disposed on the insulation structure 34P in the vertical direction D1. The first semiconductor layer 30 may surround the second semiconductor layer 32 in horizontal directions (such as the horizontal direction D2 and/or a horizontal direction D3), and the second semiconductor layer 32 may surround the third semiconductor layer 36 and the insulation structure 34P in the horizontal directions (such as the horizontal direction D2 and/or the horizontal direction D3). A portion of the semiconductor structure SS (such as the third semiconductor layer 36) may be located between the insulation structure 34P and the drain structure DE in the vertical direction D1, and a portion of the second semiconductor layer 32 may be located between the insulation structure 34P and the bottom semiconductor layer 18 in the vertical direction D1. In some embodiments, the semiconductor structure SS may be composed of the first semiconductor layer 30, the second semiconductor layer 32, and the third semiconductor layer 36, and the second semiconductor layer 32 in the semiconductor structure SS may be directly connected with (and/or physically contact) the first semiconductor layer 30, the third semiconductor layer 36, the bottom semiconductor layer 18, and the insulation structure 34P, but not limited thereto.

In some embodiments, the gate dielectric layer 28 may include a first portion 28A and a second portion 28B directly connected with the first portion 28A. The first portion 28A may extend in the vertical direction D1 substantially, and the second portion 28B may extend in the horizontal direction (such as the horizontal direction D2 and/or the horizontal direction D3) substantially and be disposed between the semiconductor structure SS and the source structure SE in the vertical direction D1. In other words, a portion of the gate dielectric layer 28 may be sandwiched between the first semiconductor layer 30 of the semiconductor structure SS and the gate structure GE in the horizontal direction, another portion of the gate dielectric layer 28 may be sandwiched between the first semiconductor layer 30 and the dielectric layer 20 in the vertical direction D1, and the gate dielectric layer 28 sandwiched between the first semiconductor layer 30 and the dielectric layer 20 in the vertical direction D1 may be regarded as a protruding portion of the gate dielectric layer 28 protruding towards the insulation structure 34P, but not limited thereto. In addition, an upper surface 34T of the insulation structure 34P may be directly connected with the third semiconductor layer 36, and the void 34V located in the insulation structure 34P may be lower than the upper surface 34T of the insulation structure 34P in the vertical direction D1. Therefore, a portion of the insulation structure 34P may be located between the void 34V and the third semiconductor layer 36 in the vertical direction D1, and another portion of the insulation structure 34P may be located between the void 34V and the second semiconductor layer 32 in the vertical direction D1, but not limited thereto. Additionally, the void 34V may be partly located in the first opening OP1 and partly located in the second opening OP2, but not limited thereto.

In some embodiments, the source structure SE, the gate structure GE, and the drain structure DE may be made of multiple layers of electrically conductive materials. For example, the source structure SE may include a barrier layer 12, a barrier layer 16, and an electrically conductive layer 14 disposed between the barrier layer 12 and the barrier layer 16 in the vertical direction D1; the gate structure GE may include a barrier layer 22 and an electrically conductive layer 24 disposed on the barrier layer 22 in the vertical direction D1; and the drain structure DE may include a barrier 40 and an electrically conductive layer 42 disposed on the barrier layer 40 in the vertical direction D1, but not limited thereto. The barrier layer 12, the barrier layer 16, the barrier layer 22, and the barrier layer 40 described above may include titanium nitride, tantalum nitride, or other suitable electrically conductive barrier materials, and the material compositions of the barrier layer 12, the barrier layer 16, the barrier layer 22, and the barrier layer 40 may be identical to or different from one another. The electrically conductive layer 14, the electrically conductive layer 24, and the electrically conductive layer 42 may include copper, aluminum, tungsten, or other suitable electrically conductive materials with low electrical resistivity, and the material compositions of the electrically conductive layer 14, the electrically conductive layer 24, and the electrically conductive layer 42 may be identical to or different from one another. In addition, the first semiconductor layer 30, the second semiconductor layer 32, and the third semiconductor layer 36 in the semiconductor structure SS and the bottom semiconductor layer 18 may include silicon-containing semiconductor materials (such as polysilicon semiconductor material or amorphous silicon semiconductor material, but not limited thereto), oxide semiconductor materials (such as indium gallium zinc oxide semiconductor material, but not limited thereto), or other suitable semiconductor materials. The materials compositions of the e first semiconductor layer 30, the second semiconductor layer 32, the third semiconductor layer 36, and the bottom semiconductor layer 18 may be identical to or different from one another.

In some embodiments, the dielectric layer 10, the dielectric layer 20, the dielectric layer 26, and the dielectric layer 38 may include oxide dielectric materials (such as silicon oxide, but not limited thereto), nitride dielectric materials (such as silicon nitride, but not limited thereto), or other suitable dielectric materials. The gate dielectric layer 28 may include an oxide dielectric material (such as silicon oxide, but not limited thereto), a nitride dielectric material (such as silicon nitride, but not limited thereto), a high dielectric constant dielectric material (such as a dielectric material with dielectric constant higher than 3.9 or 4.52), or other suitable dielectric materials. The insulation structure 34P may include an oxide insulation material (such as silicon oxide, but not limited thereto) or other suitable insulation materials. In addition, the void 34V located in the insulation structure 34P may include a seam and/or an air gap formed in the manufacturing process of forming the insulation structure 34P, but not limited thereto.

Figure 2:
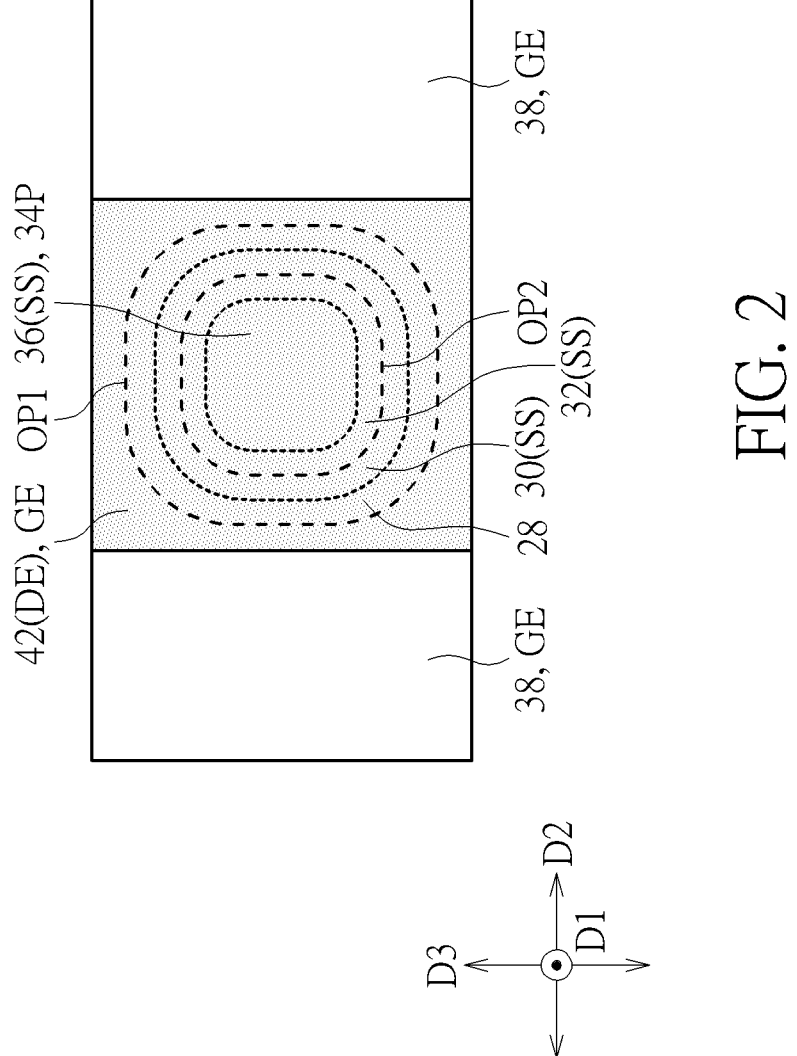
FIG. 2 is a top view schematic drawing illustrating a portion of a semiconductor device according to an embodi- ment of the present invention.

Please refer to FIG. 1 and FIG. 2. FIG. 2 is a top view schematic drawing illustrating a portion of a semiconductor device according to an embodiment of the present invention. In some embodiments, FIG. 2 may be regarded as a top view schematic drawing illustrating a portion of the semiconductor device 101 described above, but not limited thereto. As shown in FIG. 1 and FIG. 2, in some embodiments, the drain structure DE may completely cover the first opening OP1 in the vertical direction D1, and the first opening OP1 may completely cover the second opening OP2 in the vertical direction D1, but not limited thereto. In some embodiments, the gate dielectric layer 28, the first semiconductor layer 30, the second semiconductor layer 32, and the insulation structure 34P may be columnar structures extending in the vertical direction D1, and central axes of the columnar structures extending in the vertical direction D1 may substantially overlap one another when viewed in the vertical direction D1, but not limited thereto. Therefore, in the top view diagram of the semiconductor device 101, the gate structure GE may surround the semiconductor structure SS located in the first opening OP1 in the horizontal directions (such as the horizontal direction D2 and the horizontal direction D3 illustrated in FIG. 1 and/or other horizontal directions substantially orthogonal to the vertical direction D1). The second semiconductor layer 32 in the semiconductor structure SS may surround the insulation structure 34P and the third semiconductor layer 36 in the horizontal directions, the first semiconductor layer 30 may surround the second semiconductor layer 32, the insulation structure 34P, and the third semiconductor layer 36 in the horizontal directions, and the gate dielectric layer 28 may surround the first semiconductor layer 30, the second semiconductor layer 32, the insulation structure 34P, and the third semiconductor layer 36 in the horizontal directions. In addition, the semiconductor structure SS may surround the insulation structure 34P in the top view diagram of the semiconductor device 101 and the cross-sectional diagram of the semiconductor device 101. It is worth noting that the shapes of the first opening OP1 and the second opening OP2 in the top view diagram of the semiconductor device according to the present invention are not limited to the condition illustrated in FIG. 2, and the first opening OP1 and the second opening OP2 may have other different shapes according to some design considerations.

In some embodiments, the dielectric layer 10 may be disposed on a substrate (not illustrated), and the substrate may include a semiconductor substrate such as a silicon substrate, a silicon germanium semiconductor substrate, a silicon-on-insulator (SOI) substrate, or a substrate made of other suitable materials, but not limited thereto. In addition, other devices (such as transistors) and/or circuits (not illustrated) may be formed on the substrate described above, and the semiconductor device 101 may be electrically connected downward and/or upward to other devices and/or circuits on the substrate, but not limited thereto. In some embodiments, the manufacturing method of the semiconductor device 101 may be integrated with the back end of line (BEOL) process in the semiconductor manufacturing process, but not limited thereto. In some embodiments, the semiconductor device 101 may be regarded as a vertical transistor structure including a gate surrounded by a semiconductor layer in the horizontal directions, but not limited thereto.

Figure 3:
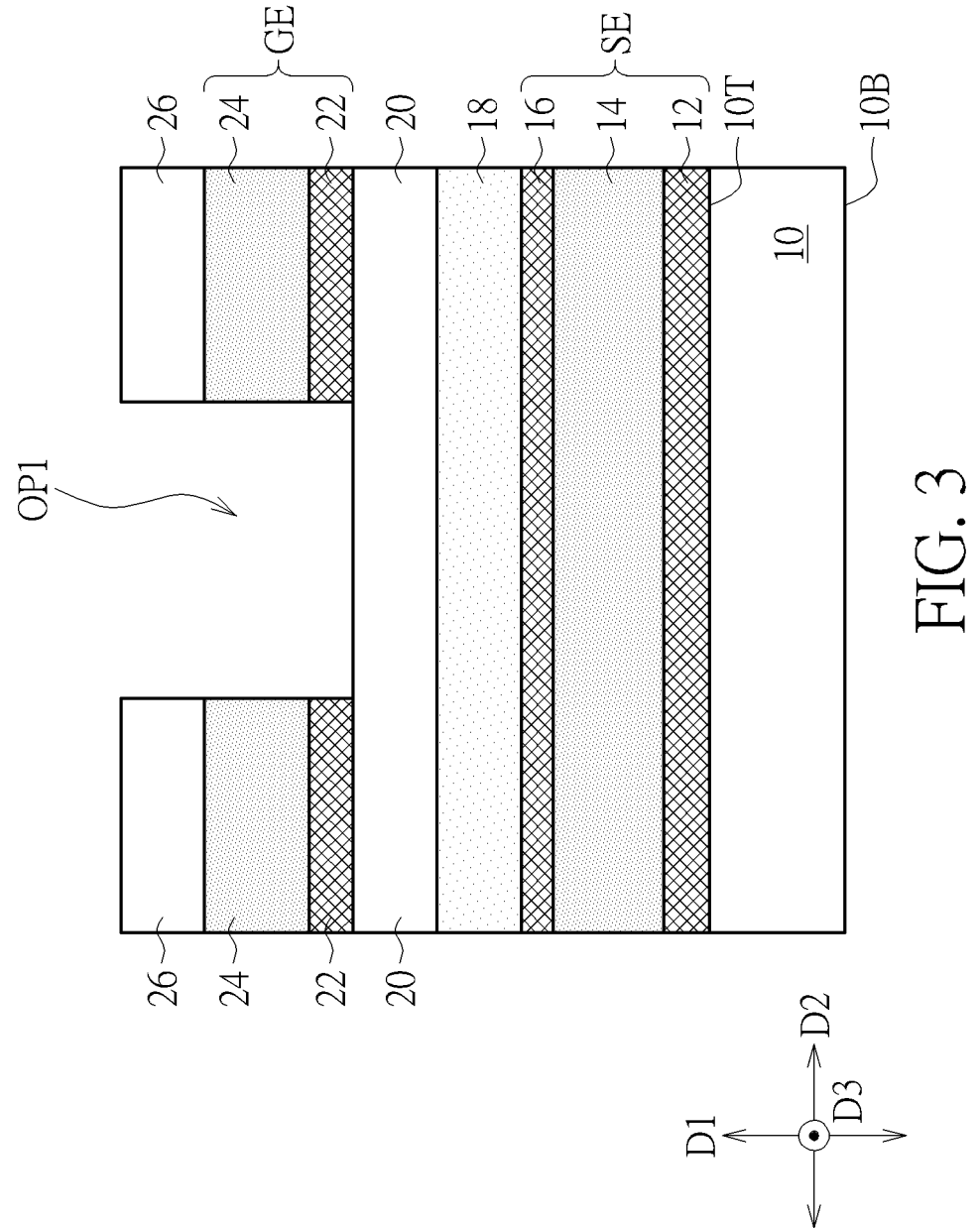
Figure 4:
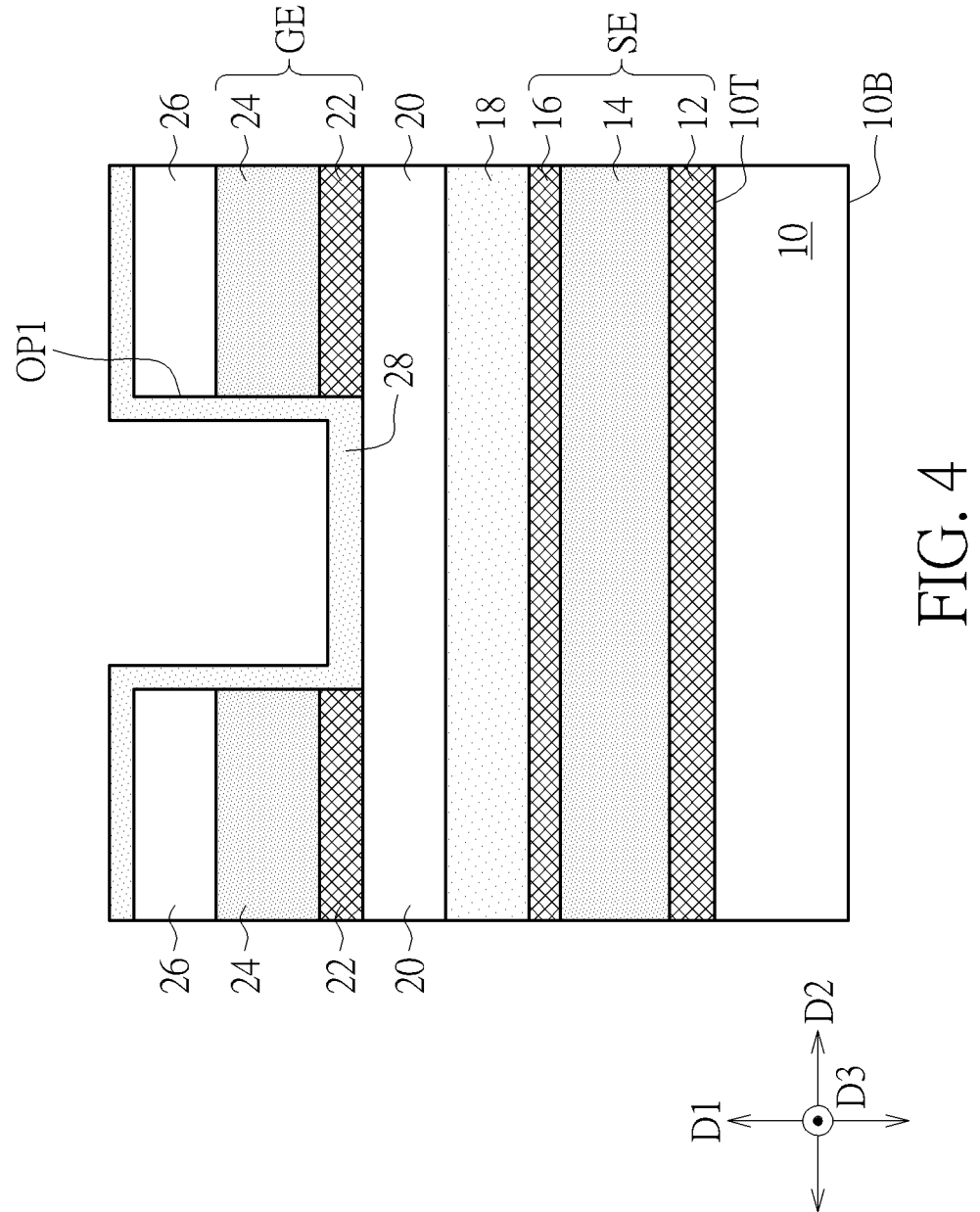
Figure 5:
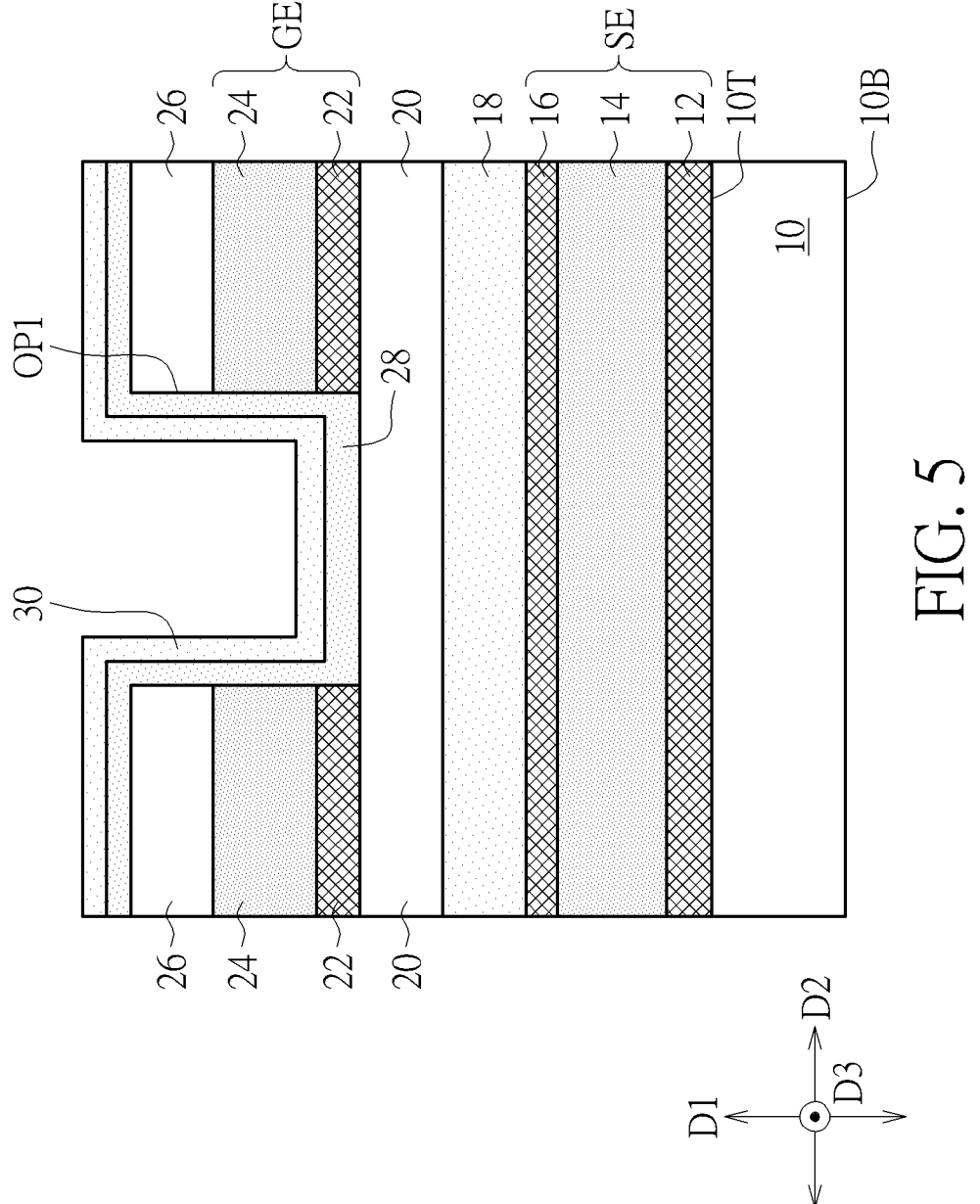
Figure 6:
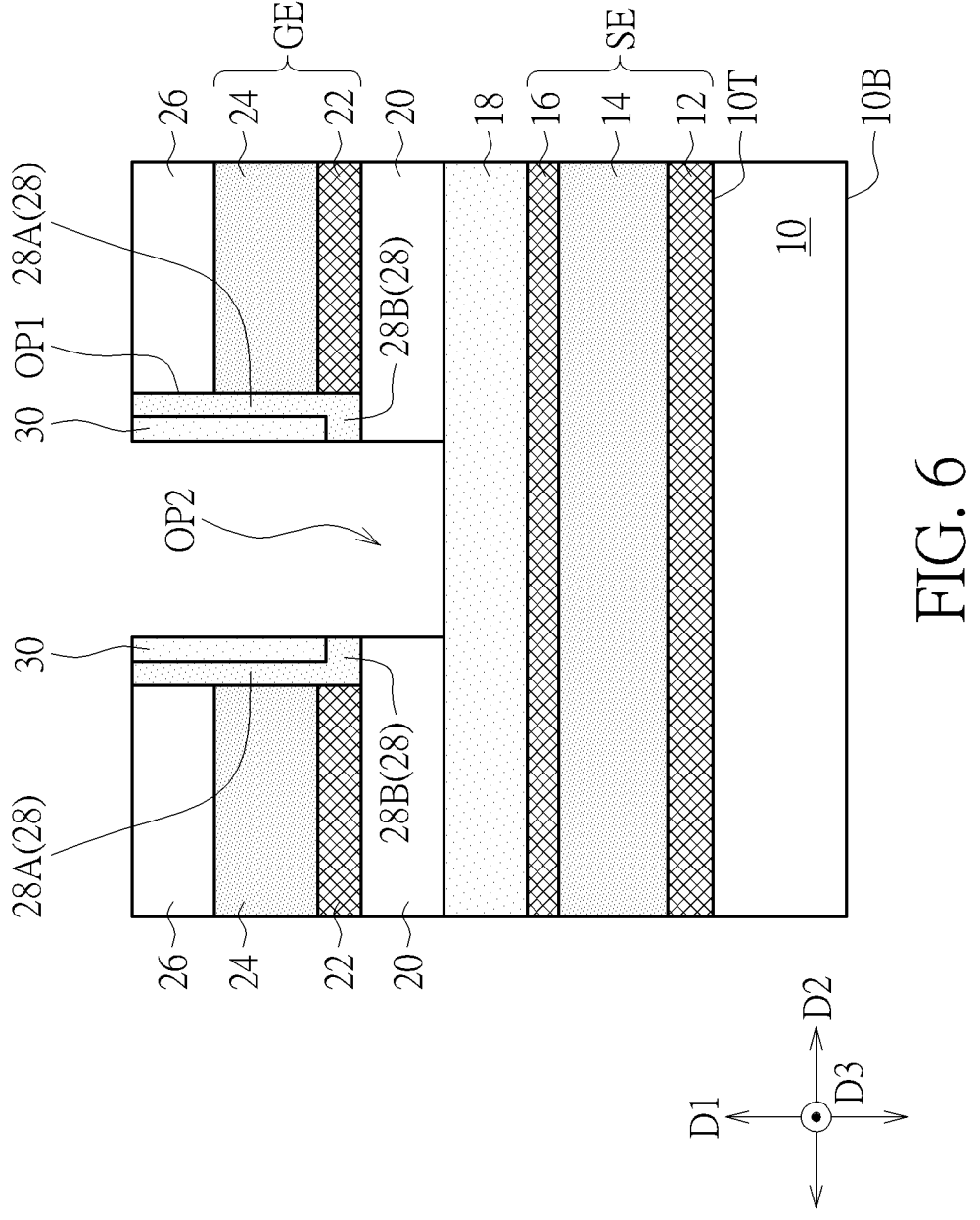
Figure 7:
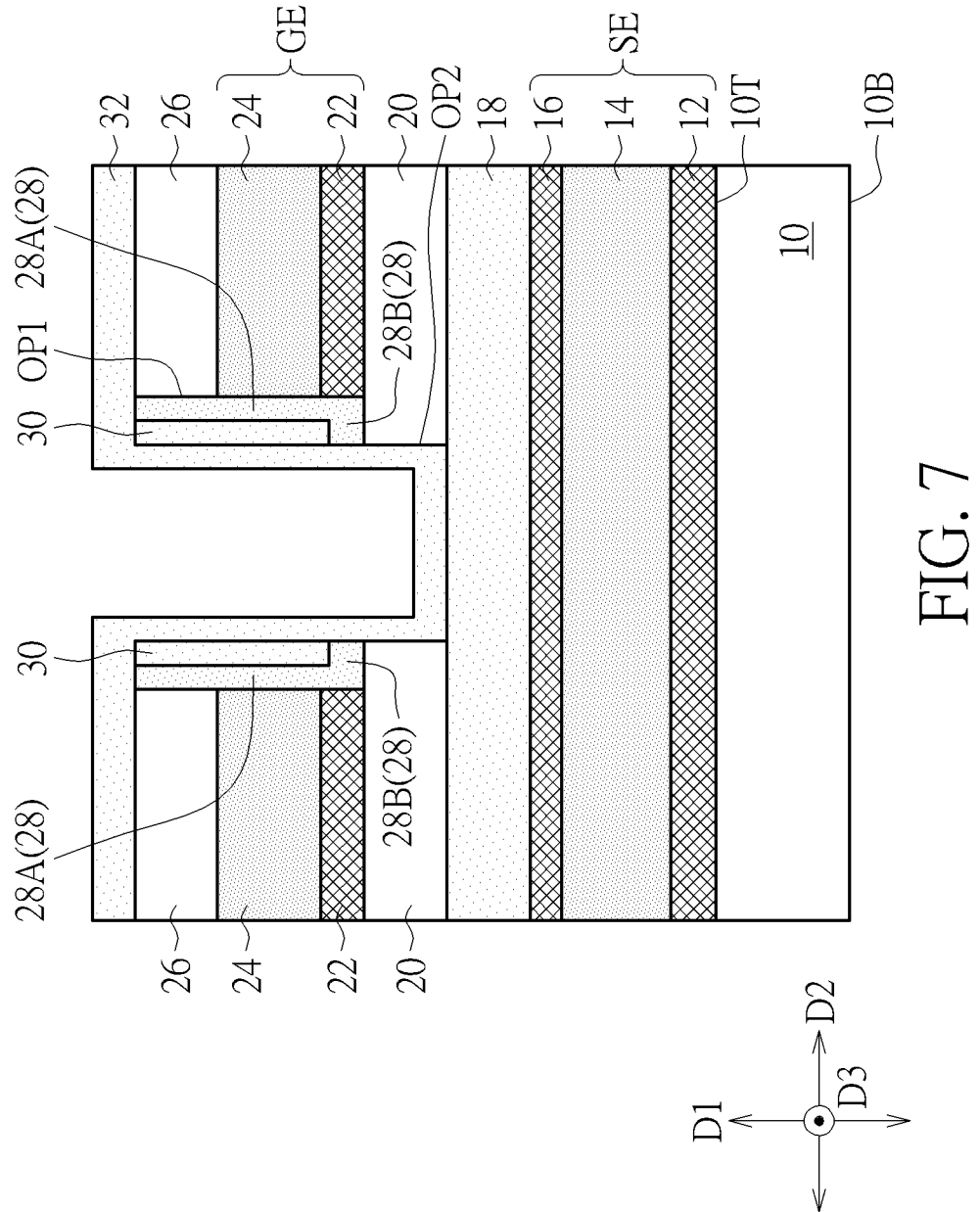
Figure 8:
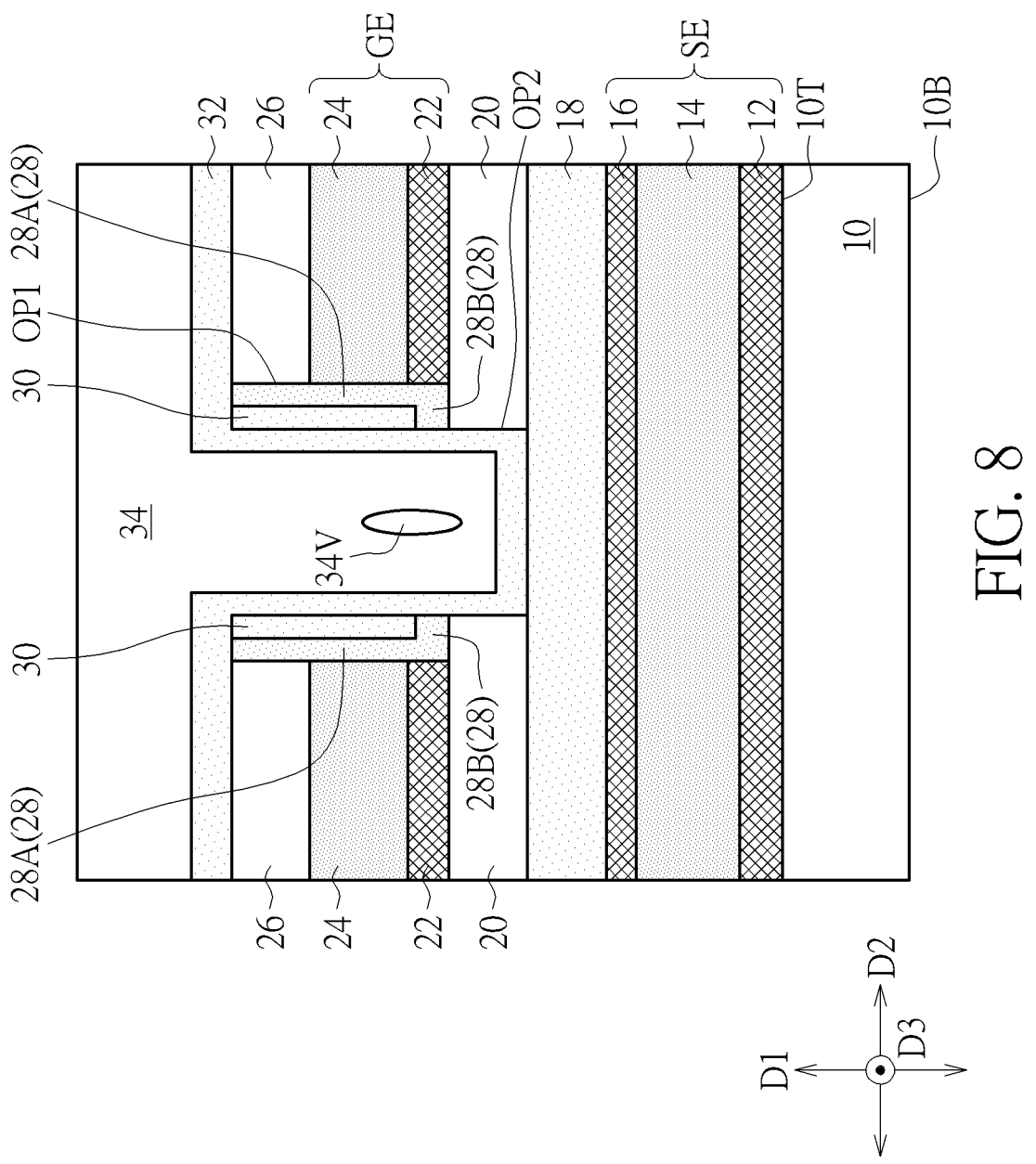
Figure 9:
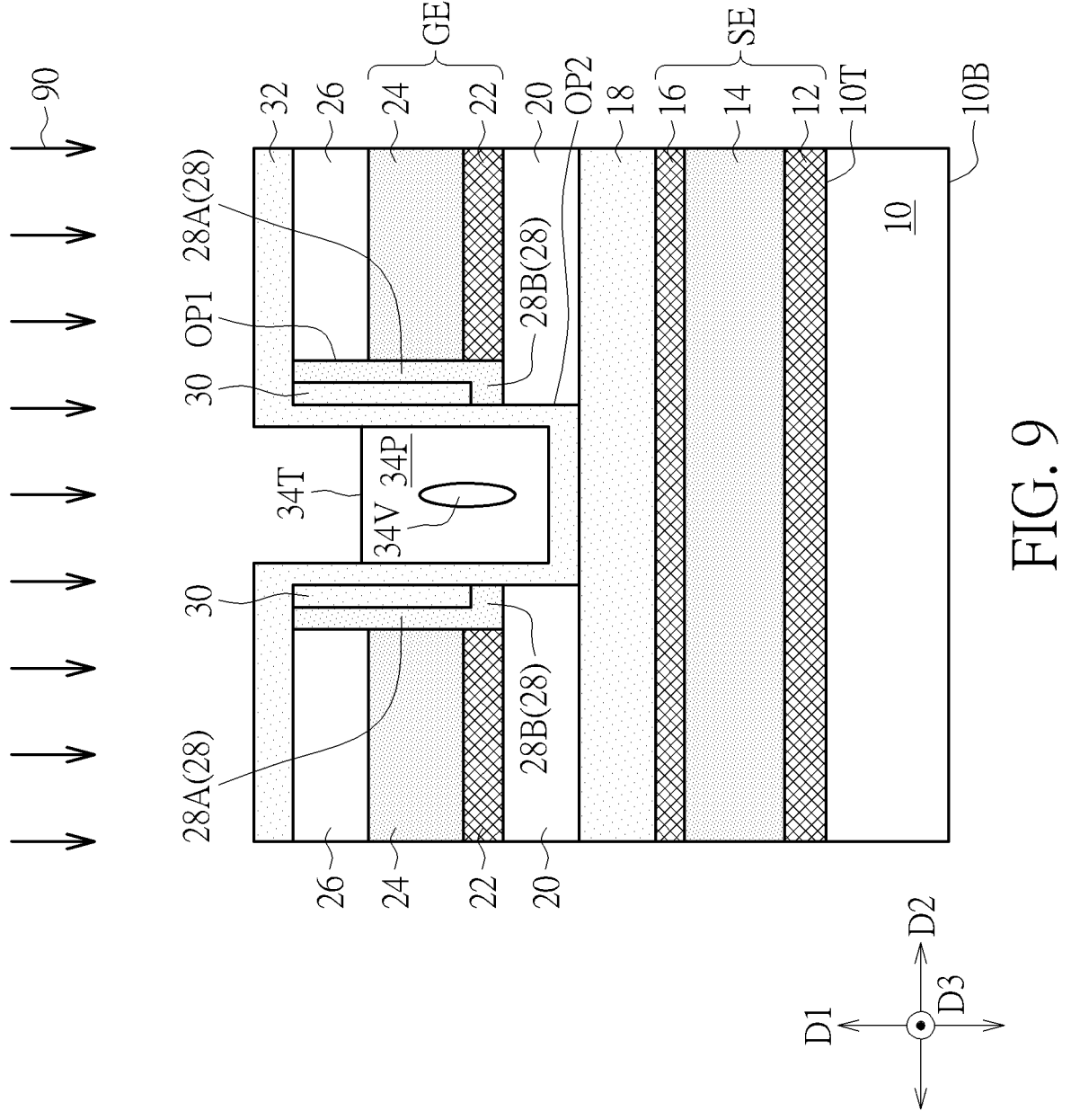

Please refer to FIG. 1 and FIGS. 3-9. FIGS. 3, FIG. 4, FIG. 5, FIG. 6, FIG. 7, FIG. 8, and FIG. 9 are schematic drawings illustrating a manufacturing method of a semiconductor device according to an embodiment of the present invention, wherein FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, and FIG. 9 is a schematic drawing in a step subsequent to FIG. 8. In some embodiments, FIG. 1 may be regarded as a schematic drawing in a step subsequent to FIG. 9, but not limited thereto. As shown in FIG. 1, the manufacturing method of the semiconductor device in this embodiment may include the following steps. The gate structure GE is formed above the source structure SE. The first opening OP1 is formed penetrating through the gate structure GE in the vertical direction D1. The gate dielectric layer 28 is formed in the first opening OP1. The insulation structure 34P and the semiconductor structure SS are formed. At least a portion of the insulation structure 34P is formed in the first opening OP1, and the semiconductor structure SS is formed partially in the first opening OP1. The void 34V is located in the insulation structure 34P. At least a portion of the gate structure GE is located at two opposite sides of the semiconductor structure SS in the horizontal direction D2, at least a portion of the semiconductor structure SS is located between the insulation structure 34P and the gate dielectric layer 28, and the gate dielectric layer 28 is located between the semiconductor structure SS and the gate structure GE.

Specifically, the manufacturing method of the semiconductor device in this embodiment may include but is not limited to the following steps. As shown in FIG. 3, the source structure SE, the bottom semiconductor layer 18, the dielectric layer 20, the gate structure GE, and the dielectric layer 26 may be sequentially formed on the upper surface 10T of the dielectric layer 10. Subsequently, the first opening OP1 is formed penetrating through the dielectric layer 26 and the gate structure GE in the vertical direction D1 for exposing a portion of the dielectric layer 20. In other words, the bottom semiconductor layer 18 and the dielectric layer 20 may be formed on the source structure SE before the step of forming the gate structure GE, and the dielectric layer 20 may be formed on the bottom semiconductor layer 18. Therefore, the bottom semiconductor layer 18 may be located between the dielectric layer 20 and the source structure SE in the vertical direction D1, and the dielectric layer 20 may be located between the gate structure GE and the bottom semiconductor layer 18 in the vertical direction D1. As shown in FIG. 4, the gate dielectric layer 28 may then be formed, and the gate dielectric layer 28 may be formed conformally on the bottom and the sidewall of the first opening OP1 and conformally formed on the dielectric layer 26. In other words, the gate dielectric layer 28 may be partly formed in the first opening OP1 and partly formed outside the first opening OP1. The gate dielectric layer 28 may be formed by a film forming process, such as a chemical vapor deposition process, a physical vapor deposition process, or other suitable approaches. Subsequently, as shown in FIG. 5, the first semiconductor layer 30 may be formed on the gate dielectric layer 28. The first semiconductor layer 30 may be formed conformally on the gate dielectric layer 28, and the first semiconductor layer 30 may be partly formed in the first opening OP1 and partly formed outside the first opening OP1 accordingly. The first semiconductor layer 30 may be formed by a film forming process, such as a chemical vapor deposition process, a physical vapor deposition process, or other suitable approaches. In some embodiments, the gate dielectric layer 28 and the first semiconductor layer 30 may be formed by the same process, and the gate dielectric layer 28 and the first semiconductor layer 30 may be formed successively in the same process chamber, but not limited thereto.

As shown in FIG. 5 and FIG. 6, after the step of forming the first semiconductor layer 30, the first semiconductor layer 30 located outside the first opening OP1 and the gate dielectric layer 28 located outside the first opening OP1 may be removed, and the second opening OP2 may be formed penetrating through the dielectric layer 20 in the vertical direction D1 for exposing a portion of the bottom semiconductor layer 18. In some embodiments, the second opening OP2 may overlap the first opening OP1 in the vertical direction D1 when viewed in the vertical direction D1, the area of the second opening OP2 in the vertical direction D1 may be less than the area of the first opening OP1 in the vertical direction D1, and the second opening OP2 may be directly connected with the first opening OP1. In addition, a portion of the first semiconductor layer 30 and a portion of the gate dielectric layer 28 located at the bottom of the first opening OP1 have to be removed for forming the second opening OP2 penetrating through the dielectric layer 20. Therefore, a portion of the first semiconductor layer 30 and a portion of the gate dielectric layer 28 may be removed by the process of forming the second opening OP2, and the gate dielectric layer 28 may have the first portion 28A and the second portion 28B described above after the step of forming the second opening OP2, but not limited thereto. As shown in FIG. 7, the second semiconductor layer 32 may be formed after the step of forming the second opening OP2. The second semiconductor layer 32 may be partly formed in the first opening OP1, partly formed in the second opening OP2, and partly formed outside the first opening OP1 and the second opening OP2. The second semiconductor layer 32 may be formed by a film forming process, such as a chemical vapor deposition process, a physical vapor deposition process, or other suitable approaches. In some embodiments, the second semiconductor layer 32 may be formed conformally on the bottom and the sidewall of the second opening OP2, the sidewall of the gate dielectric layer 28, and the sidewall of the first semiconductor layer 30. The second semiconductor layer 32 located outside the first opening OP1 and the second opening OP2 may be formed on the dielectric layer 26, the gate dielectric layer 28, and the first semiconductor layer 30 in the vertical direction D1. The first semiconductor layer 30 may surround the second semiconductor layer 32 located in the first opening OP1 in the horizontal directions, and the second semiconductor layer 32 formed in the second opening OP2 may be connected with the bottom semiconductor layer 18.

As shown in FIG. 8, after the step of forming the second semiconductor layer 32, an insulation material 34 may be formed on the second semiconductor layer 32. In some embodiments, the insulation material 34 may be partly formed in the first opening OP1, partly formed in the second opening OP2, and partly formed outside the first opening OP1 and the second opening OP2, but not limited thereto. The insulation material 34 may be formed by a film forming process, such as a chemical vapor deposition process, a physical vapor deposition process, or other suitable approaches, and the insulation material 34 may include an oxide insulation material (such as silicon oxide, but not limited thereto) or other suitable insulation materials. Additionally, the above-mentioned a void 34V may be formed in the insulation material 34 by modifying the process conditions of the process for forming the insulation material 34 and/or modifying an aspect ratio of a recess formed at the surface of the second semiconductor layer 32, but not limited thereto. Subsequently, as shown in FIG. 8 and FIG. 9, an etching back process 90 may be performed to the insulation material 34 for removing a portion of the insulation material 34 (such as removing the insulation material 34 located outside the first opening OP1 and the second opening OP2 and removing a portion of the insulation material 34 located in the first opening OP1) so as to form the insulation structure 34P. Therefore, after the etching back process 90, the topmost surface of the insulation structure 34P (such as the upper surface 34T) may be lower than the topmost surface of the dielectric layer 26 in the vertical direction D1, but not limited thereto. It is worth noting that the method of forming the insulation structure 34P in the present invention may include but is not limited to the approach shown in FIG. 8 and FIG. 9, and the insulation structure 34P illustrated in FIG. 1 may also be formed by other suitable approaches according to some design considerations.

As shown in FIG. 9 and FIG. 1, after the step of forming the insulation structure 34P, the third semiconductor layer 36 may be formed on the insulation structure 34P. In some embodiments, a planarization process may be performed for removing the third semiconductor layer 36 located outside the first opening OP1 and the second semiconductor layer 32 located outside the first opening for forming the structure illustrated in FIG. 1. Therefore, after this planarization process, the topmost surface of the dielectric layer 26, the topmost surface of the gate dielectric layer 28, the topmost surface of the first semiconductor layer 30, the topmost surface of the second semiconductor layer 32, and the topmost surface of the third semiconductor layer 36 may be substantially coplanar, but not limited thereto. The semiconductor structure SS including the first semiconductor layer 30, the second semiconductor layer 32, and the third semiconductor layer 36 may be formed by the method described above. It is worth noting that, the method of forming the semiconductor structure SS in the present invention may include but is not limited to the steps described above, and the semiconductor structure SS illustrated in FIG. 1 may also be formed by other suitable approaches according to some design considerations. As shown in FIG. 1, after the step of forming the semiconductor structure SS, the drain structure DE and the dielectric layer 38 may be formed for forming the semiconductor device 101. In some embodiments, the material composition of the dielectric layer 26 may be different from that of the dielectric layer 38 for providing required etching selectivity in the related manufacturing processes, but not limited thereto. The drain structure DE may be formed on the semiconductor structure SS and the gate dielectric layer 28, the drain structure DE may be directly connected with the semiconductor structure SS and the gate dielectric layer 28, and a portion of the semiconductor structure SS (such as the third semiconductor layer 36) may be located between the insulation structure 34P and the drain structure DE in the vertical direction D1.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 10:
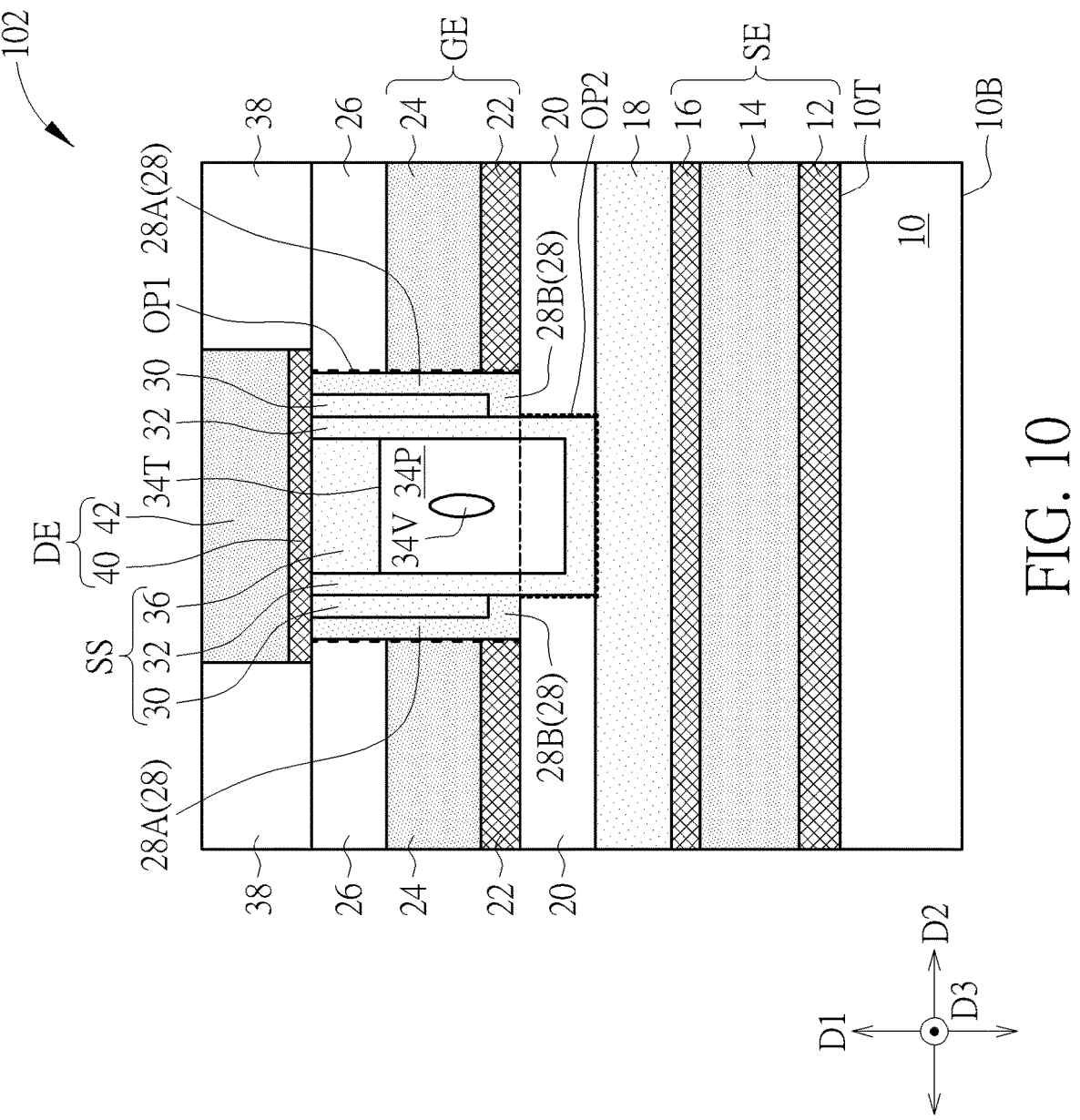
FIG. 10 is a cross-sectional schematic drawing illustrating a semiconductor device according to a second embodiment of the present invention.
Figure 11:
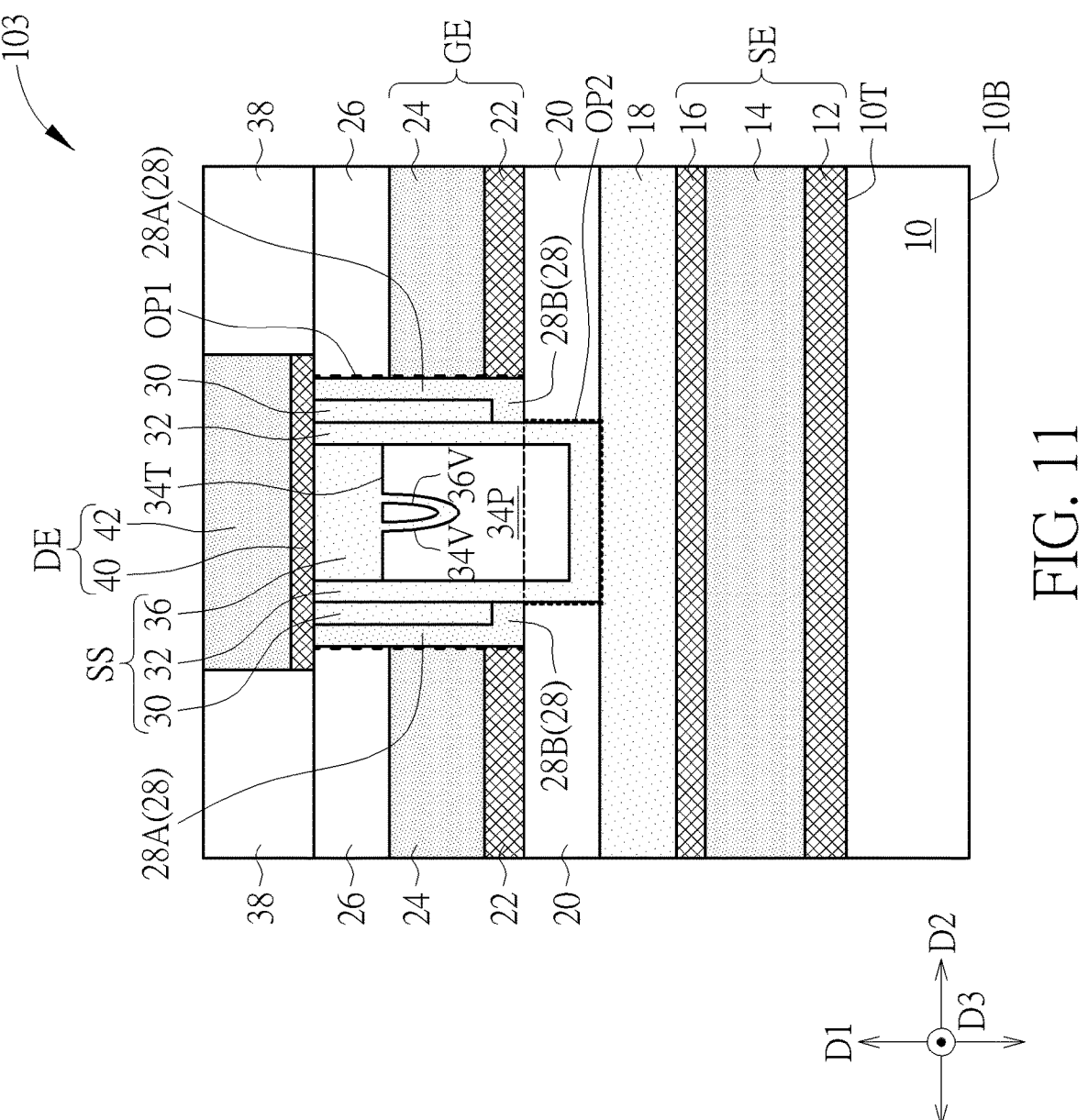
FIG. 11 is a cross-sectional schematic drawing illustrating a semiconductor device according to a third embodiment of the present invention.
Figure 12:
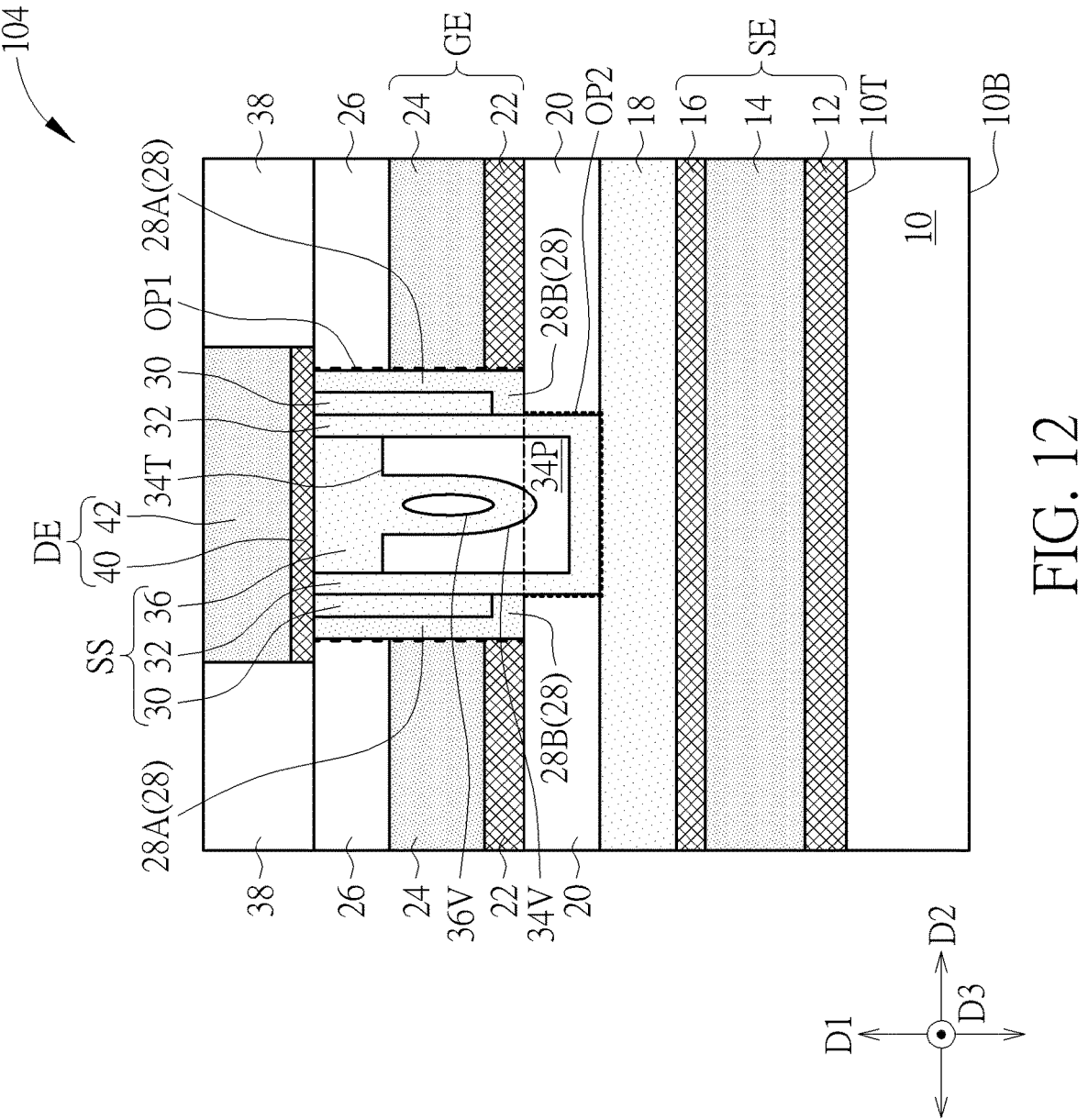
FIG. 12 is a cross-sectional schematic drawing illustrating a semiconductor device according to a fourth embodiment of the present invention.
Figure 13:
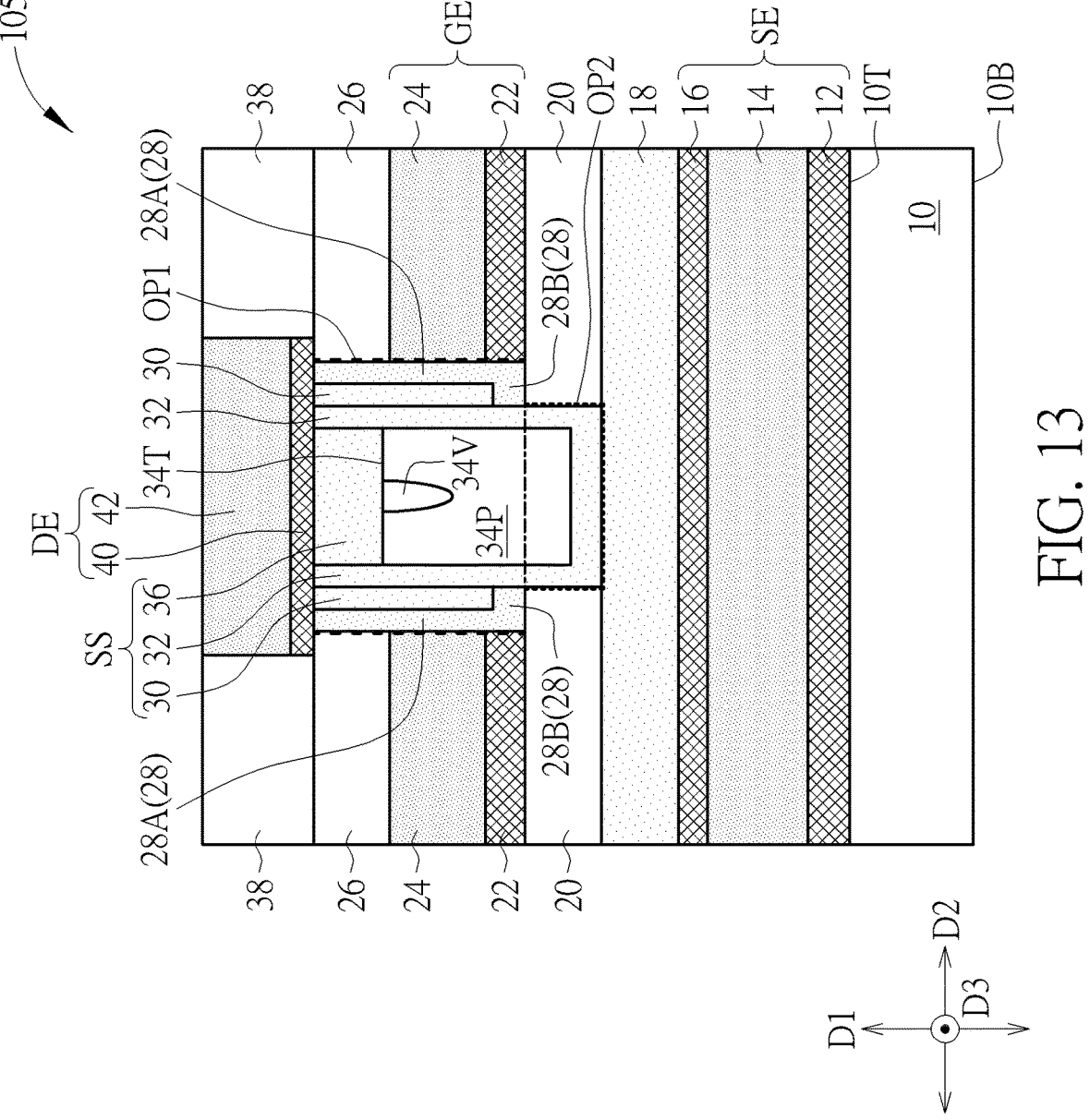
FIG. 13 is a cross-sectional schematic drawing illustrating a semiconductor device according to a fifth embodiment of the present invention.

Please refer to FIG. 10, FIG. 11, FIG. 12, FIG. 13, and FIG. 1. FIG. 10 is a cross-sectional schematic drawing illustrating a semiconductor device 102 according to a second embodiment of the present invention, FIG. 11 is a cross-sectional schematic drawing illustrating a semiconductor device 103 according to a third embodiment of the present invention, FIG. 12 is a cross-sectional schematic drawing illustrating a semiconductor device 104 according to a fourth embodiment of the present invention, and FIG. 13 is a cross-sectional schematic drawing illustrating a semiconductor device 105 according to a fifth embodiment of the present invention. In the present invention, the void described above may be formed in the insulation structure and the position of the void may be controlled by modifying the process conditions of forming the insulation structure and/or modifying the aspect ratio of the recess formed at the surface of the second semiconductor layer. For example, as shown in FIG. 10, the void 34V in the semiconductor device 102 may be completely located in the first opening OP1 without being formed in the second opening OP2. As shown in FIG. 11, in the semiconductor device 103, the void 34V may be directly connected with the upper surface 34T of the insulation structure 34P, a portion of the third semiconductor layer 36 may be formed in the void 34V, and another void 36V may be formed accordingly. In other words, the void 36V may be regarded as being formed in the third semiconductor layer 36 located in the void 34V, the void 34V may be regarded as a void including a portion of the third semiconductor layer 36 and the void 36V, and the void 36V may also be regarded as being formed and/or disposed in the insulation structure 34P. Therefore, a portion of the semiconductor structure SS (such as a portion of the third semiconductor layer 36) may be located between the void 36V and the insulation structure 34P. Additionally, as shown in FIG. 12, in the semiconductor device 104, the void 34V may be partly formed in the first opening OP1 and partly formed in the second opening OP2, the third semiconductor layer 36 located in the void 34V may be partly formed in the first opening OP1 and partly formed in the second opening OP2 also, and the void 36V may be formed in the first opening OP1, but not limited thereto. As shown in FIG. 13, in the semiconductor device 105, the void 34V may be completely located in the first opening OP1 without being formed in the second opening OP2, the void 34V may be directly connected with the upper surface 34T of the insulation structure 34P and the third semiconductor layer 36, and the third semiconductor layer 36 may not be formed in the void 34V.

To summarize the above descriptions, in the semiconductor device and the manufacturing method thereof according to the present invention, the insulation structure may be used to indirectly control the composition of the semiconductor structure surrounding the insulation structure and/or support the semiconductor structure, and the void in the insulation structure may be used to reduce the integral dielectric constant of the insulation structure for improving the operation performance of the semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
a source structure;
a gate structure disposed above the source structure;
a first opening penetrating through the gate structure in a vertical direction;
a semiconductor structure partially disposed in the first opening, wherein at least a portion of the gate structure is located at two opposite sides of the semiconductor structure in a horizontal direction;

a gate dielectric layer disposed in the first opening and located between the semiconductor structure and the gate structure;

an insulation structure, wherein at least a portion of the insulation structure is disposed in the first opening, and at least a portion of the semiconductor structure is located between the insulation structure and the gate dielectric layer; and a void located in the insulation structure.

2. The semiconductor device according to claim 1, wherein the gate dielectric layer comprises:

a first portion extending in the vertical direction; and a second portion extending in the horizontal direction and disposed between the semiconductor structure and the source structure in the vertical direction.

3. The semiconductor device according to claim 1, further comprising:

a dielectric layer disposed between the gate structure and the source structure in the vertical direction; and a bottom semiconductor layer disposed between the dielectric layer and the source structure in the vertical direction, wherein the semiconductor structure penetrates through the dielectric layer in the vertical direction for physically contacting the bottom semiconductor layer.

4. The semiconductor device according to claim 3, further comprising:

a second opening penetrating through the dielectric layer in the vertical direction, wherein the second opening is connected with the first opening, and the semiconductor structure physically contacts the bottom semiconductor layer via the second opening.

5. The semiconductor device according to claim 4, wherein the void is partly located in the first opening and partly located in the second opening.

6. The semiconductor device according to claim 4, wherein the semiconductor structure comprises:

a first semiconductor layer disposed in the first opening;

a second semiconductor layer partly disposed in the first opening and partly disposed in the second opening, wherein the first semiconductor layer surrounds the second semiconductor layer in the horizontal direction, and the second semiconductor layer physically contacts the bottom semiconductor layer; and a third semiconductor layer disposed on the insulation structure in the vertical direction, wherein the second semiconductor layer surrounds the third semiconductor layer in the horizontal direction, and the second semiconductor layer physically contacts the first semiconductor layer and the third semiconductor layer.

7. The semiconductor device according to claim 6, wherein a portion of the second semiconductor layer is located between the bottom semiconductor layer and the insulation structure in the vertical direction.

8. The semiconductor device according to claim 1, wherein a portion of the semiconductor structure is located between the void and the insulation structure.

9. The semiconductor device according to claim 1, wherein the void is lower than an upper surface of the insulation structure in the vertical direction.

10. The semiconductor device according to claim 1, wherein the void is connected with an upper surface of the insulation structure.

11. The semiconductor device according to claim 1, further comprising:

a drain structure disposed on the semiconductor structure and the gate dielectric layer, wherein a portion of the semiconductor structure is located between the insulation structure and the drain structure in the vertical direction.

12. A manufacturing method of a semiconductor device, comprising:

forming a gate structure above a source structure;

forming a first opening penetrating through the gate structure in a vertical direction;

forming a gate dielectric layer in the first opening;

forming an insulation structure, wherein at least a portion of the insulation structure is formed in the first opening; and forming a semiconductor structure partially in the first opening, wherein a void is located in the insulation structure, at least a portion of the gate structure is located at two opposite sides of the semiconductor structure in a horizontal direction, the gate dielectric layer is located between the semiconductor structure and the gate structure, and at least a portion of the semiconductor structure is located between the insulation structure and the gate dielectric layer.

13. The manufacturing method of the semiconductor device according to claim 12, further comprising:

forming a bottom semiconductor layer on the source structure before the step of forming the gate structure; and forming a dielectric layer on the bottom semiconductor layer, wherein the bottom semiconductor layer is located between the dielectric layer and the source structure in the vertical direction, and the dielectric layer is located between the gate structure and the bottom semiconductor layer in the vertical direction.

14. The manufacturing method of the semiconductor device according to claim 13, wherein a method of forming the semiconductor structure comprises:

forming a first semiconductor layer on the gate dielectric layer; and forming a second opening penetrating through the dielectric layer in the vertical direction, wherein the second opening is connected with the first opening, and a portion of the first semiconductor layer and a portion of the gate dielectric layer are removed by a process of forming the second opening.

15. The manufacturing method of the semiconductor device according to claim 14, wherein the method of forming the semiconductor structure further comprises:

forming a second semiconductor layer after the step of forming the second opening, wherein the second semiconductor layer is partly formed in the first opening and partly formed in the second opening, and the second semiconductor layer physically contacts the bottom semiconductor layer.

16. The manufacturing method of the semiconductor device according to claim 15, wherein a portion of the second semiconductor layer is located between the bottom semiconductor layer and the insulation structure in the vertical direction.

17. The manufacturing method of the semiconductor device according to claim 15, wherein a method of forming the insulation structure comprises:

forming an insulation material on the second semiconductor layer after the second semiconductor layer is formed; and performing an etching back process to the insulation material for removing a portion of the insulation material and forming the insulation structure.

18. The manufacturing method of the semiconductor device according to claim 17, wherein the method of forming the semiconductor structure further comprises:

forming a third semiconductor layer on the insulation structure, wherein the second semiconductor layer physically contacts the first semiconductor layer and the third semiconductor layer, and the semiconductor structure comprises the first semiconductor layer, the second semiconductor layer, and the third semiconductor layer.

19. The manufacturing method of the semiconductor device according to claim 12, wherein the gate dielectric layer comprises:

a first portion extending in the vertical direction; and a second portion extending in the horizontal direction and located between the semiconductor structure and the source structure in the vertical direction.

20. The manufacturing method of the semiconductor device according to claim 12, further comprising:

forming a drain structure on the semiconductor structure and the gate dielectric layer, wherein a portion of the semiconductor structure is located between the insulation structure and the drain structure in the vertical direction.

* * * * *